United States Patent
Ishimura et al.

(10) Patent No.: US 8,035,181 B2
(45) Date of Patent: Oct. 11, 2011

(54) SEMICONDUCTOR PHOTODETECTOR WITH IMPROVED QUANTUM EFFICIENCY AS A FUNCTION OF DETECTED LIGHT WAVELENGTH

(75) Inventors: Eitaro Ishimura, Tokyo (JP); Masaharu Nakaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 365 days.

(21) Appl. No.: 12/327,861

(22) Filed: Dec. 4, 2008

(65) Prior Publication Data
US 2010/0006967 A1 Jan. 14, 2010

(30) Foreign Application Priority Data
Jul. 10, 2008 (JP) ................................. 2008-180151

(51) Int. Cl.
*H01L 31/0232* (2006.01)
(52) U.S. Cl. .. 257/436; 257/431; 257/437; 257/E31.127
(58) Field of Classification Search .................. 257/431, 257/436, 437, E31.127
See application file for complete search history.

(56) References Cited

U.S. PATENT DOCUMENTS
5,293,393 A * 3/1994 Kosaka ....................... 372/45.01
7,566,942 B2 * 7/2009 Viens et al. .................... 257/440

FOREIGN PATENT DOCUMENTS
JP 2001-308368 A 11/2001

* cited by examiner

*Primary Examiner* — Lex Malsawma
*Assistant Examiner* — Robert Huber
(74) *Attorney, Agent, or Firm* — Leydig, Voit & Mayer, Ltd.

(57) ABSTRACT

A semiconductor photodetector comprises: a semiconductor substrate; a first multilayer reflective layer on a first surface of the semiconductor substrate and including semiconductor layers; a first optically-resonant layer on the first multilayer reflective layer; a second multilayer reflective layer on the first optically-resonant layer and including semiconductor layers; a light absorbing layer on the second multilayer reflective layer; a reflective film on the light absorbing layer; and an antireflective film on a second surface of the semiconductor substrate. The first optically-resonant layer has a larger thickness than the semiconductor layers of the first and second multilayer reflective layers. The combined optical thickness of the layers between the second multilayer reflective layer and the reflective film is not equal to the optical thickness of the first optically-resonant layer.

6 Claims, 5 Drawing Sheets

SEMICONDUCTOR PHOTODETECTOR WITH IMPROVED QUANTUM EFFICIENCY AS A FUNCTION OF DETECTED LIGHT WAVELENGTH

BACKGROUND OF THE INVENTION

1. Field of the Invention

The present invention relates to a resonant cavity enhanced semiconductor photodetector, and more particularly to such a semiconductor photodetector which exhibits reduced variation in quantum efficiency with wavelength.

2. Background Art

In recent years, as more and more optical transmission systems for optical communications have been designed to operate at ultrahigh speed, there is a need to increase the efficiency and speed of semiconductor photodetectors, which make up the backbone of these optical transmission systems. In order to meet this need, use has been made of resonant cavity enhanced photodiodes (or PDs), in which light is repeatedly reflected to increase the light absorption efficiency (see, e.g., Japanese Laid-Open Patent Publication No. 2001-308368).

SUMMARY OF THE INVENTION

FIG. 8 is a cross-sectional view of a resonant cavity enhanced photodiode adapted to receive incident light on its front surface (or anode electrode side). This PD (photodiode) includes an n-type multilayer reflective layer (or reflective multilayer stack) 102, an n-type phase adjusting layer 104, a light absorbing layer 106, a p-type phase adjusting layer 108, a p-type multilayer reflective layer 110, and an anode electrode 112 stacked on top of one another on the upper surface of a semiconductor substrate 100 in that order. A cathode electrode 114 is formed on the lower surface of the semiconductor substrate 110. This PD is mounted on a base 116.

The multilayer reflective layers 102 and 110 are multilayer stacks composed of alternating semiconductor layers of different refractive indices, e.g., InP and InGaAsP, etc., and act to reflect or transmit light. The phase adjusting layers 104 and 108 have a larger bandgap than the light absorbing layer 106 and are made of, e.g., InP or InGaAsP, etc. These phase adjusting layers 104 and 108 permit generation of resonant modes between the multilayer reflective layers 102 and 110.

The operation of the resonant cavity enhanced PD of FIG. 8 will be briefly described. A reverse bias of approximately 5 V is applied to the PD so that the potential of the anode electrode 112 is lower than that of the cathode electrode 114. Light incident on the PD from the upper side of FIG. 8 travels back and forth (i.e., resonates) between the multilayer reflective layers 102 and 110 while being progressively absorbed by the light absorbing layer 106, thereby generating electron-hole pairs. These electrons and holes flow to the cathode electrode 114 side and the anode electrode 112 side, resulting in the generation of an output current. Thus, in resonant cavity enhanced PDs, the incident light is caused to travel back and forth a number of times (or resonate) through the light absorbing layer so that it is progressively absorbed in the layer, resulting in high quantum efficiency and high resonant Q even if the light absorbing layer has a small thickness. It should be noted that the quantum efficiency is the probability that a photon incident on the PD produces an electron-hole pair.

This type of resonant cavity enhanced PD is disadvantageous in that its quantum efficiency is significantly wavelength dependent since it utilizes optical resonance as described above. To address this problem, the present inventor devised the PD shown in FIG. 9. Specifically, FIG. 9 is a cross-sectional view of a resonant cavity enhanced photodiode adapted to receive incident light on its back surface (or cathode electrode side). This PD includes an n-type multilayer reflective layer 120, a light absorbing layer 122, a p-type phase adjusting layer 124, and an anode electrode 126 stacked on top of one another on the lower surface of a semiconductor substrate 118 in that order. A cathode electrode 128 is formed on the upper surface of the semiconductor substrate 118, and has an opening filled with an antireflective film 130. Light incident on the PD from the upper side of FIG. 9 travels back and forth (i.e., resonates) between the multilayer reflective layer 120 and the anode electrode 126 while being progressively absorbed by the light absorbing layer 122, as in the PD of FIG. 8.

FIG. 10 shows the wavelength dependence of the quantum efficiency of the PD shown in FIG. 9. As shown in FIG. 10, the quantum efficiency of the PD of FIG. 9 has a relatively weak dependence on wavelength, since the light absorbing layer 122 accounts for a large proportion of the thickness of the resonant cavity defined between the multilayer reflective layer 120 and the anode electrode 126 and since the anode electrode 126, which varies only slightly in reflectance with wavelength, is used as a reflective film. The wavelength range over which the quantum efficiency exceeds 90% of its maximum value is 45 nm wide. It should be noted that the width of this range indicates the wavelength dependence of the quantum efficiency (i.e., the wider this range, the lower the wavelength dependence).

However, the quantum efficiency of the PD shown in FIG. 9 still varies significantly with wavelength, although it is less wavelength dependent than that of the PD shown in FIG. 8. When used in optical communications, the PD may receive wavelengths of light within the range of 1520-1620 nm, meaning that the quantum efficiency of the PD may vary by as much as approximately 30% depending on the wavelength range of the incident light. Therefore, if this PD is used as the receiving PD of an optical receiver, the receiver may not be able to achieve a sufficient sensitivity level, depending on the wavelength of the incident light. Further, the performance of an optical receiver must be inspected at various wavelengths prior to shipping if the quantum efficiency of its receiving PD varies widely with wavelength.

The present invention has been devised to solve the above problems. It is, therefore, an object of the present invention to provide a semiconductor photodetector that exhibits reduced variation in quantum efficiency with wavelength.

According to one aspect of the present invention, a semiconductor photodetector comprises: a semiconductor substrate; a first multilayer reflective layer on a lower surface of said semiconductor substrate and including semiconductor layers; a first optically-resonant layer on said first multilayer reflective layer; a second multilayer reflective layer on said first optically-resonant layer and including semiconductor layers; a light absorbing layer on said second multilayer reflective layer; a reflective film on said light absorbing layer; and an antireflective film on an upper surface of said semiconductor substrate; wherein said first optically-resonant layer has a greater thickness than said semiconductor layers of said first and second multilayer reflective layers; and wherein the combined optical thickness of the layers between said second multilayer reflective layer and said reflective film is not equal to the optical thickness of said first optically-resonant layer.

Thus the present invention provides a semiconductor photodetector that exhibits reduced variation in quantum efficiency with wavelength.

DETAILED DESCRIPTION OF THE PREFERRED EMBODIMENTS

First Embodiment

Figure 1:
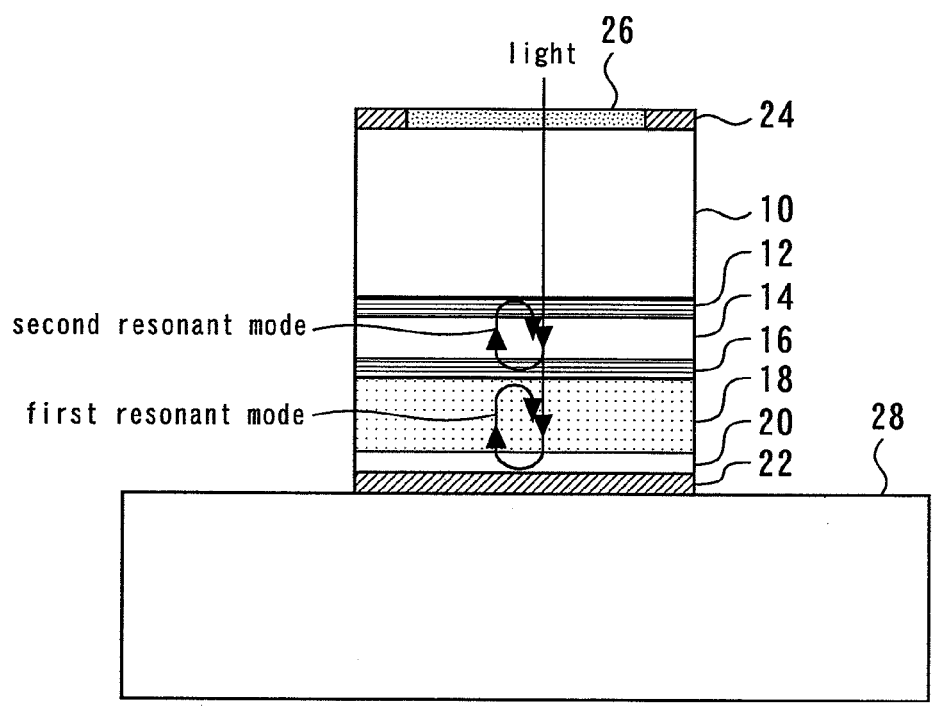
FIG. 1 is a cross-sectional view of a semiconductor photodetector according to a first embodiment of the present invention.

FIG. 1 is a cross-sectional view of a semiconductor photodetector according to a first embodiment of the present invention. This semiconductor photodetector is a resonant cavity enhanced photodiode adapted to receive incident light on its back surface (or cathode electrode side).

This PD includes an n-type first multilayer reflective layer 12, an n-type first optically-resonant layer 14, an n-type second multilayer reflective layer 16, an i-type InGaAs light absorbing layer 18, a p-type phase adjusting layer 20, and an anode electrode 22 (also serving as a reflective film) stacked on top of one another on the lower surface of an n-type InP substrate 10 (a semiconductor substrate) in that order. A cathode electrode 24 is formed on the upper surface of the n-type InP substrate 10, and has an opening filled with an antireflective film 26. This PD is mounted on a base 28.

The first and second multilayer reflective layers 12 and 16 are distributed Bragg reflectors (DBRs) which are multilayer stacks of alternating semiconductor layers of different refractive indices. Each semiconductor layer in the first and second multilayer reflective layers 12 and 16 has an optical thickness equal to approximately n times one-quarter wavelength of the light incident on the PD (where n=1, 3, 5, 7, . . . ). Specifically, the first and second multilayer reflective layers 12 and 16 may be composed of alternating layers of two different materials selected from the group consisting of InGaAs/InP, InGaAsP/InP, AlInAs/AlGaInAs, AlInAs/InGaAs, two different compositions of InGaAsP, and two different compositions of AlGaInAs. Alternatively, the first and second multilayer reflective layers 12 and 16 may be composed of alternating layers of three different materials selected from the materials listed above.

The first optically-resonant layer 14 has a greater thickness than the semiconductor layers of the first and second multilayer reflective layers 12 and 16, and is made of a material having a larger bandgap than the light absorbing layer 18 (e.g., InP, InGaAsP, or AlGaInAs).

The p-type phase adjusting layer 20 is also made of a material having a larger bandgap than the light absorbing layer 18 (e.g., InP). The anode electrode 22 reflects back the light transmitted thereto through the light absorbing layer 18. The base 28 serves to allow power supply to the anode electrode 22, as well as to allow escape of heat generated in the PD.

Figure 9:
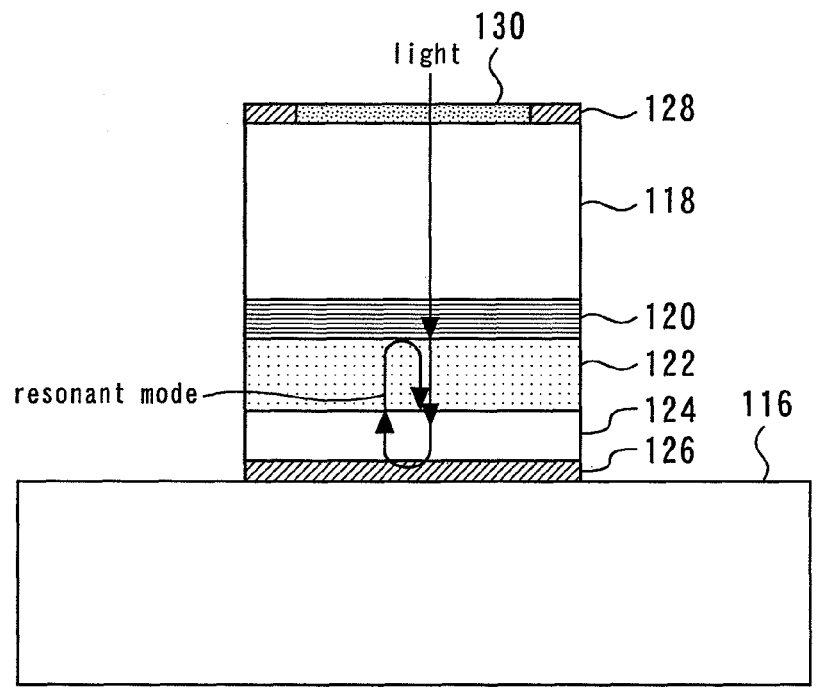
FIG. 9 is a cross-sectional view of a resonant cavity enhanced photodiode adapted to receive incident light on its back surface.

The advantages of the PD of the present embodiment will be described by comparing it with the PD of FIG. 9. The term "first optical thickness" is herein used to refer to the combined optical thickness of the light absorbing layer 18 and the phase adjusting layer 20 disposed between the second multilayer reflective layer 16 and the anode electrode 22. Further, let Lopt1 denote this thickness. If the first optical thickness Lopt1 and the wavelength λ of the light incident on the PD satisfy the following relationship, the optical resonance between the second multilayer reflective layer 16 and the anode electrode 22 (herein referred to as the "first resonant mode") is maximized and the light travels back and forth through the light absorbing layer 18 a number of times resulting in high sensitivity of the PD:

$$Lopt1 = n*\lambda/4 \quad (1)$$

where n is an integer. This equation indicates that the quantum efficiency is maximized at a particular wavelength λ1. In the case of the PD shown in FIG. 9, its quantum efficiency is maximized only at this wavelength λ1.

In the case of the PD of the present embodiment, on the other hand, the first optically-resonant layer 14 is disposed between the first and second multilayer reflective layers 12 and 16. This results in occurrence of optical resonance between the first and second multilayer reflective layers 12 and 16 (herein referred to as the "second resonant mode"). The optical thickness of the first optically-resonant layer 14 is herein referred to as the "second optical thickness," and denoted by Lopt2. The first optical thickness Lopt1 is not equal to the second optical thickness Lopt2, as expressed below.

$$Lopt1 *\neq Lopt2 \quad (2)$$

Therefore, the quantum efficiency of the PD of the present embodiment is maximized at two different wavelengths λ1 and λ2, thereby reducing its wavelength dependence. Practically, the second optical thickness Lopt 2 is from a few times smaller to a few times larger than the first optical thickness Lopt1.

The wavelength dependence of the quantum efficiency of the PD can be further reduced by satisfying the following equations:

$$Lopt1 = (2*n-1)*\lambda/4 \quad (3)$$

$$Lopt2 = 2*n*\lambda/4 \quad (4)$$

where n is an integer and λ is the wavelength of the incident light.

The reason for this is that satisfying these conditions ensures that the resonant peak wavelengths of the first resonant mode coincide with the resonant bottom wavelengths of the second resonant mode. (It should be noted that solving Equation (3) for λ yields the resonant peak wavelengths of the first resonant mode, and solving Equation (4) for λ yields the resonant bottom wavelengths of the second resonant mode.) Likewise, the wavelength dependence of the quantum efficiency of the PD can also be further reduced by satisfying the following relations:

$$Lopt1=2*n*\lambda/4 \qquad (5)$$

$$Lopt2=(2*n-1)*\lambda/4 \qquad (6)$$

Figure 2:
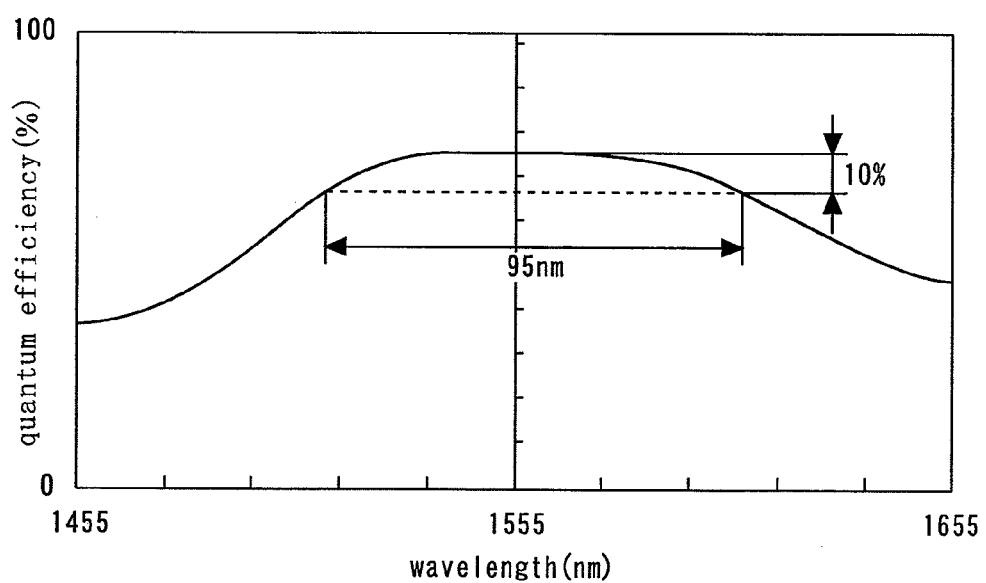
FIG. 2 shows the wavelength dependence of the quantum efficiency of the PD of FIG. 1.
Figure 10:
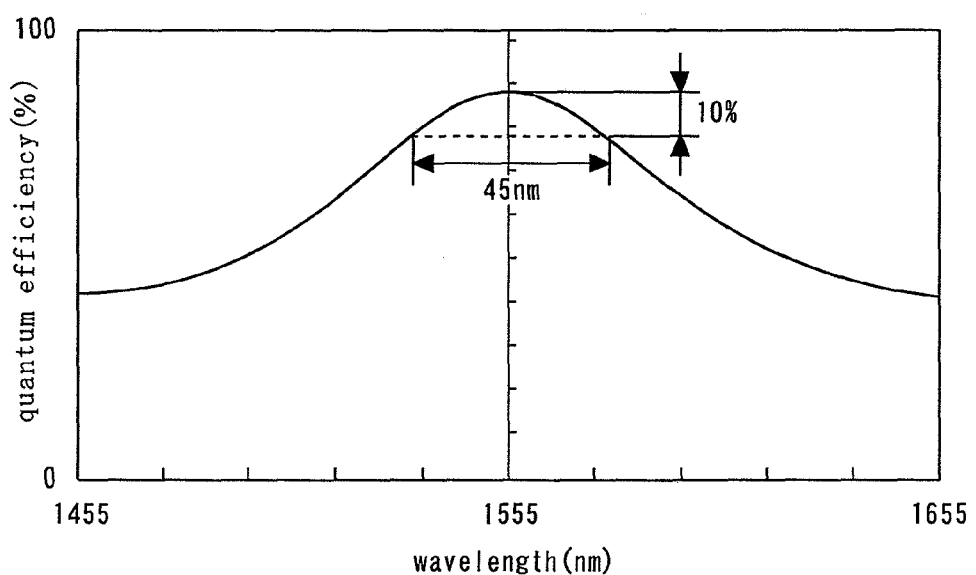
FIG. 10 shows the wavelength dependence of the quantum efficiency of the PD shown in FIG. 9.

FIG. 2 shows the wavelength dependence of the quantum efficiency of the PD of FIG. 1 assuming that Equations (3) and (4) are satisfied and the absorbing layer has a thickness of 0.8 μm. As can be seen by comparison between FIG. 2 and FIG. 10, the quantum efficiency of the PD of FIG. 1 is significantly less wavelength dependent than that of the PD of FIG. 9. In FIG. 2, the wavelength range over which the quantum efficiency exceeds 90% of its maximum value is 95 nm wide. (The quantum efficiency is maximized at a wavelength of 1555 nm.) That is, this wavelength range is approximately twice as wide as the corresponding wavelength range for the PD of FIG. 9 (which is 45 nm wide).

Further, the first multilayer reflective layer 12 preferably has a lower reflectance than the second multilayer reflective layer 16. This is achieved when the number N1 of layers in the first multilayer reflective layer 12 is smaller than the number N2 of layers in the second multilayer reflective layer 16, as expressed below.

$$N1<N2 \qquad (7)$$

This ensures that the first resonant mode acts to increase the quantum efficiency in the same manner as described in connection with the PD shown in FIG. 9. As a result, the PD of the present embodiment still has high quantum efficiency.

Second Embodiment

Figure 3:
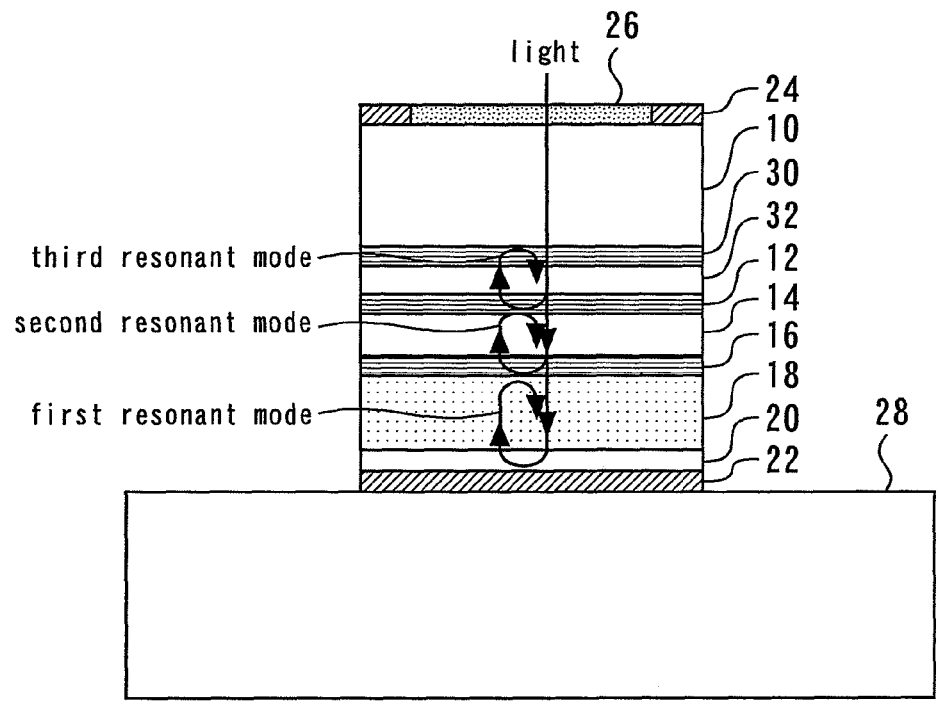
FIG. 3 is a cross-sectional view of a semiconductor photodetector according to a second embodiment of the present invention.

FIG. 3 is a cross-sectional view of a semiconductor photodetector according to a second embodiment of the present invention. It should be noted that components common to the first embodiment shown in FIG. 1 bear the same reference numerals. Referring to FIG. 3, a third multilayer reflective layer 30 and a second optically-resonant layer 32 are stacked on the lower surface of the n-type InP substrate 10 in that order; that is, they lie between the substrate 10 and the first multilayer reflective layer 12. The second optically-resonant layer 32 has a greater thickness than each semiconductor layer in the first to third multilayer reflective layers 12, 16, and 30. All other components are the same as in the first embodiment.

This construction causes optical resonance (or a third resonant mode) to be generated between the first multilayer reflective layer 12 and the third multilayer reflective layer 30. The optical thickness Lopt3 of the second optically-resonant layer 32 is not equal to the first optical thickness Lopt1 and the second optical thickness Lopt2 (of the first optically resonant layer 14), as expressed below.

$$Lopt1 \neq Lopt2 \neq Lopt3 \qquad (8)$$

This means that the quantum efficiency of the PD of the present embodiment has peaks at three different wavelengths λ1, λ2, and λ3 (corresponding to the first to third optical thicknesses, respectively), reducing the wavelength dependence of the quantum efficiency over a wider wavelength range as compared to the first embodiment.

Third Embodiment

Figure 4:
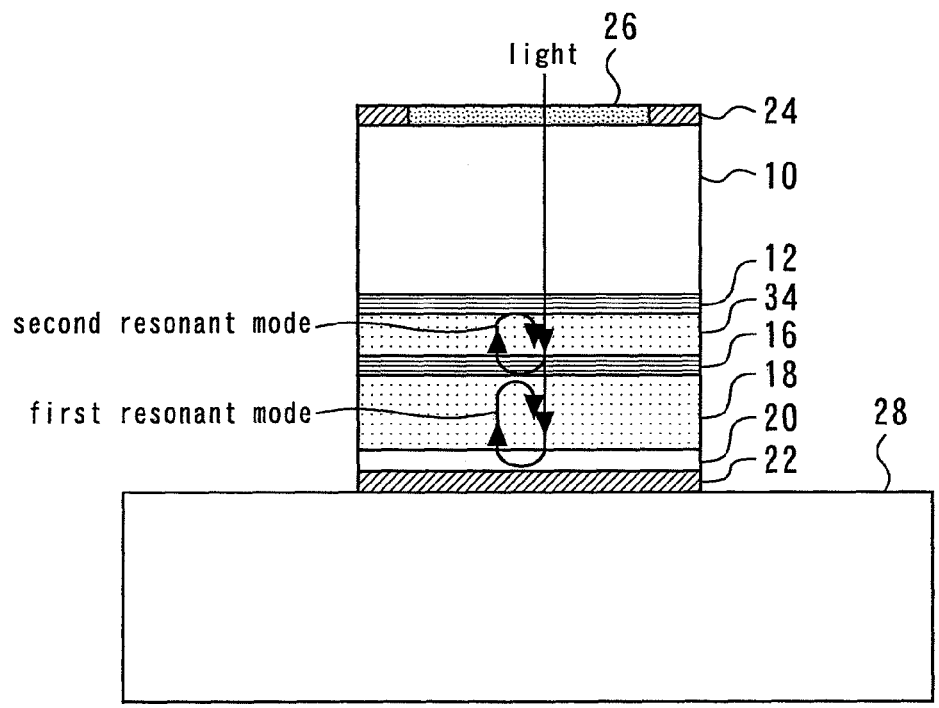
FIG. 4 is a cross-sectional view of a semiconductor photodetector according to a third embodiment of the present invention.

FIG. 4 is a cross-sectional view of a semiconductor photodetector according to a third embodiment of the present invention. This semiconductor photodetector differs from that of the first embodiment in that the first optically-resonant layer 14 is replaced by a first optically-resonant layer 34 having a longer bandgap wavelength than the wavelength of the incident light. Thus the first optically-resonant layer 34 is light absorptive, and the electrons and holes generated therein may be collected as a photocurrent, resulting in high quantum efficiency.

Fourth Embodiment

Figure 5:
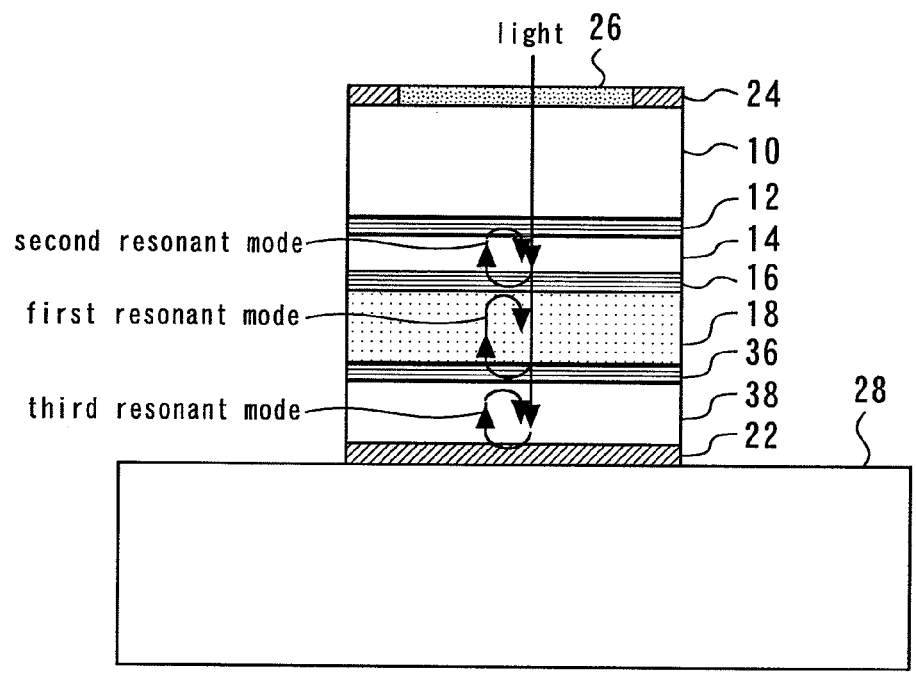
FIG. 5 is a cross-sectional view of a semiconductor photodetector according to a fourth embodiment of the present invention.

FIG. 5 is a cross-sectional view of a semiconductor photodetector according to a fourth embodiment of the present invention. This photodetector includes a first multilayer reflective layer 12, a first optically-resonant layer 14, a second multilayer reflective layer 16, a light absorbing layer 18, a third multilayer reflective layer 36, a second optically-resonant layer 38, and an anode electrode 22 (also serving as a reflective film) stacked on top of one another on the lower surface of an n-type InP substrate 10 in that order. All other components are the same as in the first embodiment.

The first and second optically-resonant layers 14 and 38 have a greater thickness than the semiconductor layers in the first to third multilayer reflective layers 12, 16, and 36, as in the first embodiment. Further, the first optically-resonant layer 14, the second optically-resonant layer 38, and the light absorbing layer 18, which is disposed between the second and third multilayer reflective layers 16 and 36, have different optical thicknesses.

This construction also has the advantages described above in connection with the first embodiment. Further, the resonant cavity is symmetrical with respect to the light absorbing layer 18, meaning that the quantum efficiency vs. wavelength curve is symmetrical with respect to a peak wavelength.

Fifth Embodiment

Figure 6:
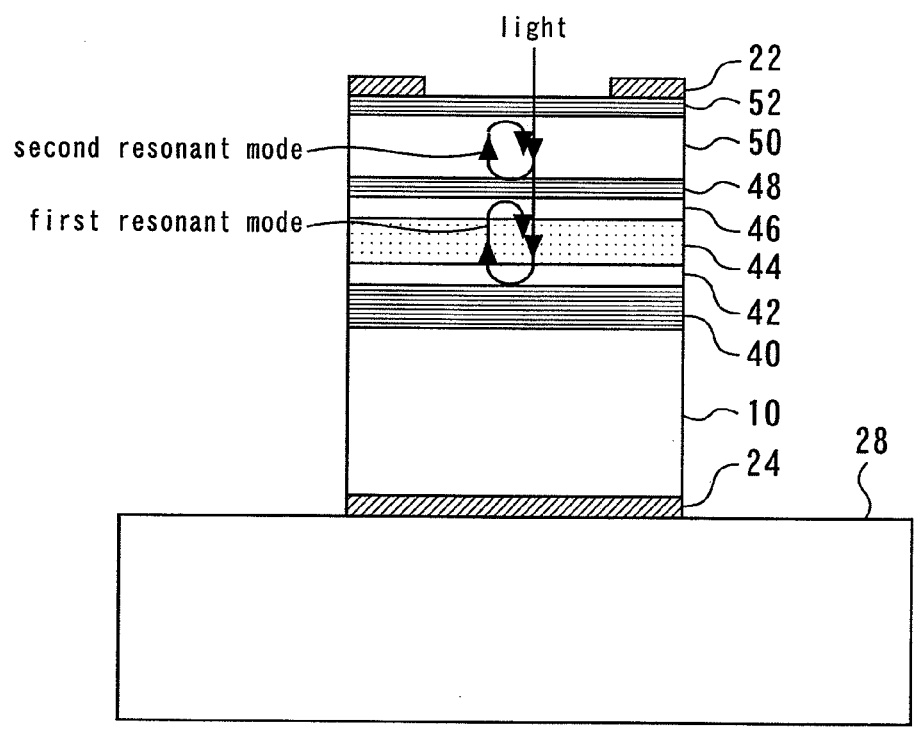
FIG. 6 is a cross-sectional view of a semiconductor photodetector according to a fifth embodiment of the present invention.

FIG. 6 is a cross-sectional view of a semiconductor photodetector according to a fifth embodiment of the present invention. This semiconductor photodetector is a resonant cavity enhanced photodiode adapted to receive incident light on its front surface (or anode electrode side).

This photodetector includes an n-type first multilayer reflective layer 40, an n-type phase adjusting layer 42, an i-type InGaAs light absorbing layer 44, a p-type phase adjusting layer 46, a p-type second multilayer reflective layer 48, a p-type optically-resonant layer 50, a p-type third multilayer reflective layer 52, and an anode electrode 22 stacked on top of one another on the upper surface of an n-type InP substrate 10 (a semiconductor substrate) in that order. A cathode electrode 24 is formed on the lower surface of the n-type InP substrate 10.

The optically-resonant layer 50 has a greater thickness than the semiconductor layers in the first and second multilayer reflective layers 40 and 48, as in the first embodiment. The term "first optical thickness" is herein used to the combined optical thickness of the semiconductor layers between the first and second multilayer reflective layers 40 and 48. Further, the term "second optical thickness" is herein used to refer to the optical thickness of the optically-resonant layer 50. These first and second optical thicknesses are not equal, ensuring the advantages described above in connection with the first embodiment.

Sixth Embodiment

Figure 7:
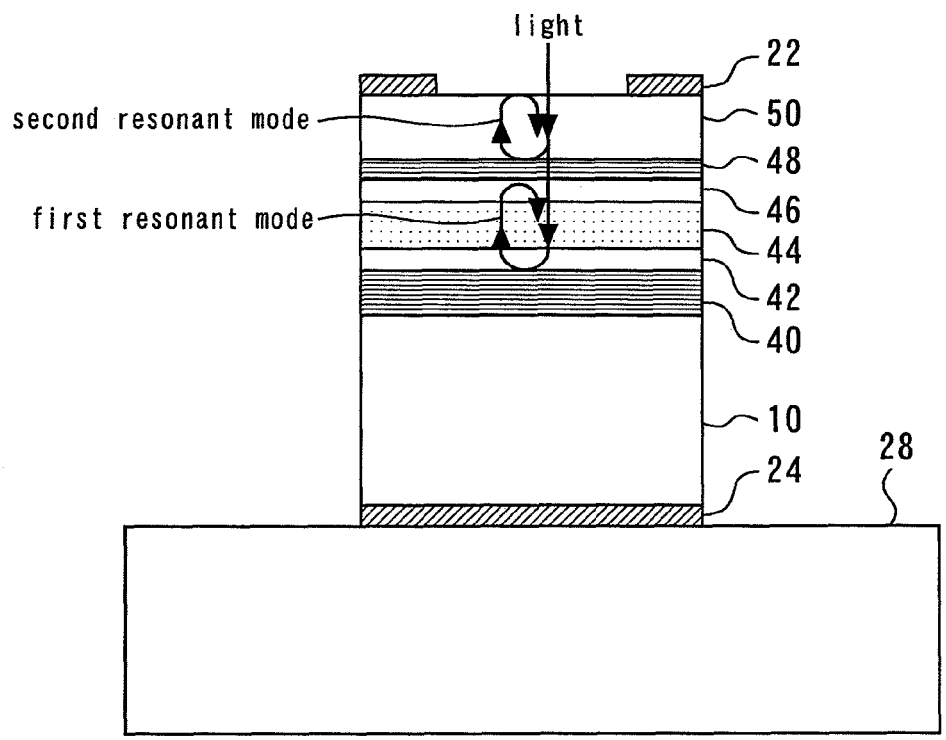
FIG. 7 is a cross-sectional view of a semiconductor photodetector according to a sixth embodiment of the present invention.
Figure 8:
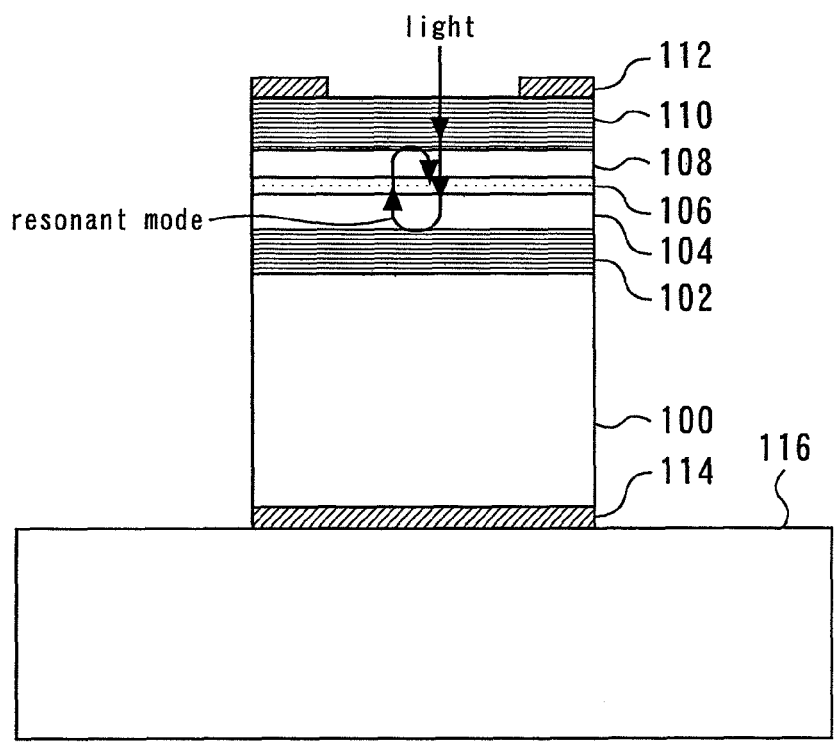
FIG. 8 is a cross-sectional view of a resonant cavity enhanced photodiode adapted to receive incident light on its front surface.

FIG. 7 is a cross-sectional view of a semiconductor photodetector according to a sixth embodiment of the present invention. This semiconductor photodetector differs from that of the fifth embodiment only in that it does not include the third multilayer reflective layer 52 and the upper surface of the optically-resonant layer 50 is exposed to ambient air. This semiconductor photodetector functions in the same manner as the semiconductor photodetector of the fifth embodiment, which includes the third multilayer reflective layer 52. The reason for this is that the upper surface (or light incident surface) of the optically-resonant layer 50 reflects light as shown in FIG. 7 since air and the optically-resonant layer 50 have different refractive indices. It should be noted that a reflective film, such as an insulating film, or an antireflective film may be formed on the upper surface of the optically-resonant layer 50 for reflectance adjustment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-180151, filed on Jul. 10, 2008 including specification, claims, drawings and summary, on which the Convention priority of the present application is based, are incorporated herein by reference in its entirety.

What is claimed is:

1. A semiconductor photodetector comprising:
   a semiconductor substrate having opposed first and second surfaces;
   a first multilayer reflective layer on the first surface of said semiconductor substrate and including a plurality of semiconductor layers;
   a first optically-resonant layer on said first multilayer reflective layer and having an optical thickness;
   a second multilayer reflective layer on said first optically-resonant layer and including a plurality of semiconductor layers;
   a light absorbing layer on said second multilayer reflective layer;
   a phase adjusting layer in physical contact with said light absorbing layer;
   a first electrode on said phase adjusting layer; and
   a second electrode and an antireflective film on the second surface of said semiconductor substrate and on which light detected by said photodetector is incident, wherein
   said first optically-resonant layer has a larger thickness than said semiconductor layers of said first and second multilayer reflective layers, and
   total optical thickness of the layers between said second multilayer reflective layer and said first electrode is not equal to the optical thickness of said first optically-resonant layer.

2. The semiconductor photodetector as claimed in claim 1, wherein
   the total optical thickness of the layers between said second multilayer reflective layer and said first electrode is $(2*n-1)*\lambda/4$,
   the optical thickness of said first optically-resonant layer is $2*n*\lambda/4$, and
   n is an integer and $\lambda$, is a wavelength of light that is incident on and detected by said semiconductor photodetector.

3. The semiconductor photodetector as claimed in claim 1, wherein
   the total optical thickness of the layers between said second multilayer reflective film and said first electrode is $2*n*\lambda/4$,
   the optical thickness of said first optically-resonant layer is $(2*n-1)*\lambda/4$, and
   n is an integer and $\lambda$ is a wavelength of light that is incident on and detected by said semiconductor photodetector.

4. The semiconductor photodetector as claimed in claim 1, wherein said first multilayer reflective layer has a lower reflectance than said second multilayer reflective layer.

5. The semiconductor photodetector as claimed in claim 1, further comprising:
   a third multilayer reflective layer and a second optically-resonant layer, having an optical thickness, both of said third multilayer reflective layer and said second optically-resonant layer being disposed between the first surface of said semiconductor substrate and said first multilayer reflective layer, wherein
   said third multilayer reflective layer is in physical contact with the first surface of said semiconductor substrate and includes a plurality of semiconductor layers,
   said second optically-resonant layer is in physical contact with said third multilayer reflective layer,
   said second optically-resonant layer has a larger thickness than said semiconductor layers of said first, second, and third multilayer reflective layers, and
   the optical thickness of said second optically-resonant layer is not equal to the total optical thickness of the layers between said second multilayer reflective layer and said first electrode and the optical thickness of the first optically-resonant layer.

6. The semiconductor photodetector as claimed in claim 1, wherein said first optically-resonant layer has a longer bandgap wavelength than wavelengths of light that are incident on and detected by said semiconductor photodetector.

* * * * *